United States Patent
Lee

(10) Patent No.: US 9,927,156 B2
(45) Date of Patent: Mar. 27, 2018

(54) HEAT EXCHANGING DEVICE USING THERMOELECTRIC ELEMENT

(71) Applicant: HYUNDAI MOTOR COMPANY, Seoul (KR)

(72) Inventor: Gun Goo Lee, Suwon-si (KR)

(73) Assignee: Hyundai Motor Company, Seoul (KR)

( * ) Notice: Subject to any disclaimer, the term of this patent is extended or adjusted under 35 U.S.C. 154(b) by 169 days.

(21) Appl. No.: 14/990,579

(22) Filed: Jan. 7, 2016

(65) Prior Publication Data

US 2017/0108252 A1     Apr. 20, 2017

(30) Foreign Application Priority Data

Oct. 20, 2015   (KR) .................. 10-2015-0146302

(51) Int. Cl.
*F25B 21/02*     (2006.01)
*F28D 1/047*     (2006.01)
*F28D 1/02*      (2006.01)

(52) U.S. Cl.
CPC .............. *F25B 21/02* (2013.01); *F28D 1/024* (2013.01); *F28D 1/047* (2013.01); *F25B 2321/0252* (2013.01)

(58) Field of Classification Search
CPC .................. F25B 21/02; F25B 2321/0252
See application file for complete search history.

(56) References Cited

U.S. PATENT DOCUMENTS

| 3,196,620 | A | * | 7/1965 | Elfving | ................ F24F 5/0042 136/204 |
| 4,281,516 | A | * | 8/1981 | Berthet | .................. F25B 21/02 62/3.3 |
| 2006/0216582 | A1 | | 9/2006 | Lee et al. | |

FOREIGN PATENT DOCUMENTS

| KR | 10-0648698 B1 | 11/2006 |
| KR | 101018920 B1 | 3/2011 |
| KR | 101046130 B1 | 7/2011 |
| KR | 10-2013-0071759 A | 7/2013 |
| KR | 10-1285411 B1 | 7/2013 |
| KR | 10-2013-0104165 A | 9/2013 |

OTHER PUBLICATIONS

Korean Office Action dated Oct. 27, 2016 issued in Korean Patent Application No. 10-2015-0146302.

* cited by examiner

*Primary Examiner* — Cassey D Bauer
(74) *Attorney, Agent, or Firm* — McDermott Will & Emery LLP

(57) ABSTRACT

A heat exchanging device using a thermoelectric element includes a thermoelectric element for generating heat absorption or heat generation on different surfaces thereof when a voltage is applied thereto, a heat sink for cooling the thermoelectric element, and a cooling channel for cooling a coolant through the heat absorption of the thermoelectric element.

5 Claims, 5 Drawing Sheets

HEAT EXCHANGING DEVICE USING THERMOELECTRIC ELEMENT

CROSS-REFERENCE TO RELATED APPLICATION

This application claims the benefit of priority to Korean Patent Application No. 10-2015-0146302, filed on Oct. 20, 2015 with the Korean Intellectual Property Office, the disclosure of which is incorporated herein in its entirety by reference.

TECHNICAL FIELD

The present disclosure relates to a heat exchanging device using a thermoelectric element, and more particularly, to a heat exchanging device using a thermoelectric element capable of adjusting cooling performance depending on a heating value of a battery by performing heat exchange through the thermoelectric element and implementing a water cooling type heat management system configured in a structure independent from a cooling air conditioning system.

BACKGROUND

Generally, an air cooling device includes an evaporator, a condenser, a compressor, an expansion valve, and the like, connected to each other by pipes, and lowers a temperature by heat-exchanging a refrigerant circulated therein with indoor air while compressing and expanding the refrigerant.

A chiller for a vehicle according to the related art has a structure in which a battery is cooled by heat-exchanging a cold refrigerant for a vehicle and a hot battery coolant with each other in a dual pipe or similar structure and then introducing the chilled battery coolant into a battery system.

Here, since the chiller should be associated with a vehicle cooling air conditioning system in order to cool the battery coolant, it has a complicated layout.

In addition, a structure of cooling the coolant using a thermoelectric element is configured to include the thermoelectric element, a heat sink cooling the thermoelectric element, and a cooling channel cooling the coolant.

Here, the heat sink is inserted into a coolant tank, and the coolant tank is filled with another coolant to cool the heat sink.

However, in the related art, it is impossible to multiply stack assemblies of the heat sink, the thermoelectric element, and the cooling channel. It is thus impossible to cool a predetermined amount (or more) of coolant, and a temperature of the coolant in the coolant tank cooling the heat sink is raised at the time of use for a long period of time such that cooling performance of the thermoelectric element is deteriorated.

SUMMARY

The present disclosure has been made to solve the above-mentioned problems occurring in the prior art while advantages achieved by the prior art are maintained intact.

An aspect of the present disclosure provides a heat exchanging device using a thermoelectric element capable of adjusting cooling performance depending on a heating value of a battery by performing heat exchange through the thermoelectric element and implementing a water cooling type heat management system configured in a structure independent from a cooling air conditioning system.

According to an exemplary embodiment of the present disclosure, a heat exchanging device using a thermoelectric element may include: a thermoelectric element for producing heat absorption and heat generation on different surfaces thereof when a voltage is applied thereto; a heat sink for cooling the thermoelectric element; and a cooling channel for cooling a coolant through the heat absorption of the thermoelectric element.

The heat generation may be produced on one surface of the thermoelectric element, and the heat absorption may be generated on an other surface thereof, such that the heat sink is provided on one surface of the thermoelectric element, and the cooling channel is provided on the other surface of the thermoelectric element.

The thermoelectric element may be formed by connecting a P-type semiconductor and an N-type semiconductor made of a compound ($Bi_2Te_3$) of bismuth and tellurium to each other.

A plurality of thermoelectric elements, a plurality of heat sinks, and a plurality of cooling channels may be provided to form a unit module, and a plurality of unit modules may be provided and stacked.

The plurality of cooling channels may be connected to each other through connection hoses.

The cooling channel may include an inlet for receiving the coolant and an outlet for exhausting the cooled coolant.

A plurality of cooling fans for improving cooling performance may be provided outside the unit module.

According to another exemplary embodiment of the present disclosure, a heat exchanging device using a thermoelectric element may include: a thermoelectric element having a structure in which a P-type semiconductor and an N-type semiconductor are connected to each other to produce heat generation on one surface thereof and generate heat absorption on the other surface thereof when a voltage is applied thereto; a heat sink provided on one surface of the thermoelectric element for cooling the thermoelectric element; and a cooling channel provided on the other surface of the thermoelectric element for cooling a coolant through the heat absorption of the thermoelectric element, wherein a plurality of thermoelectric elements, a plurality of heat sinks, and a plurality of cooling channels are provided to form a unit module, and a plurality of unit modules are provided and stacked.

The plurality of cooling channels may be connected to each other through connection hoses, and the cooling channel may include an inlet for receiving the coolant and an outlet for exhausting the cooled coolant.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Exemplary embodiments of the present disclosure will be described in detail with reference to the accompanying drawings.

A heat exchanging device using a thermoelectric element according to an exemplary embodiment of the present disclosure may include a thermoelectric element 100 in which heat absorption or heat generation occurs, a heat sink 110 for cooling the thermoelectric element 100, and a cooling channel 120 for cooling a coolant through the thermoelectric element 100, as illustrated in FIGS. 1 to 4.

Figure 1:
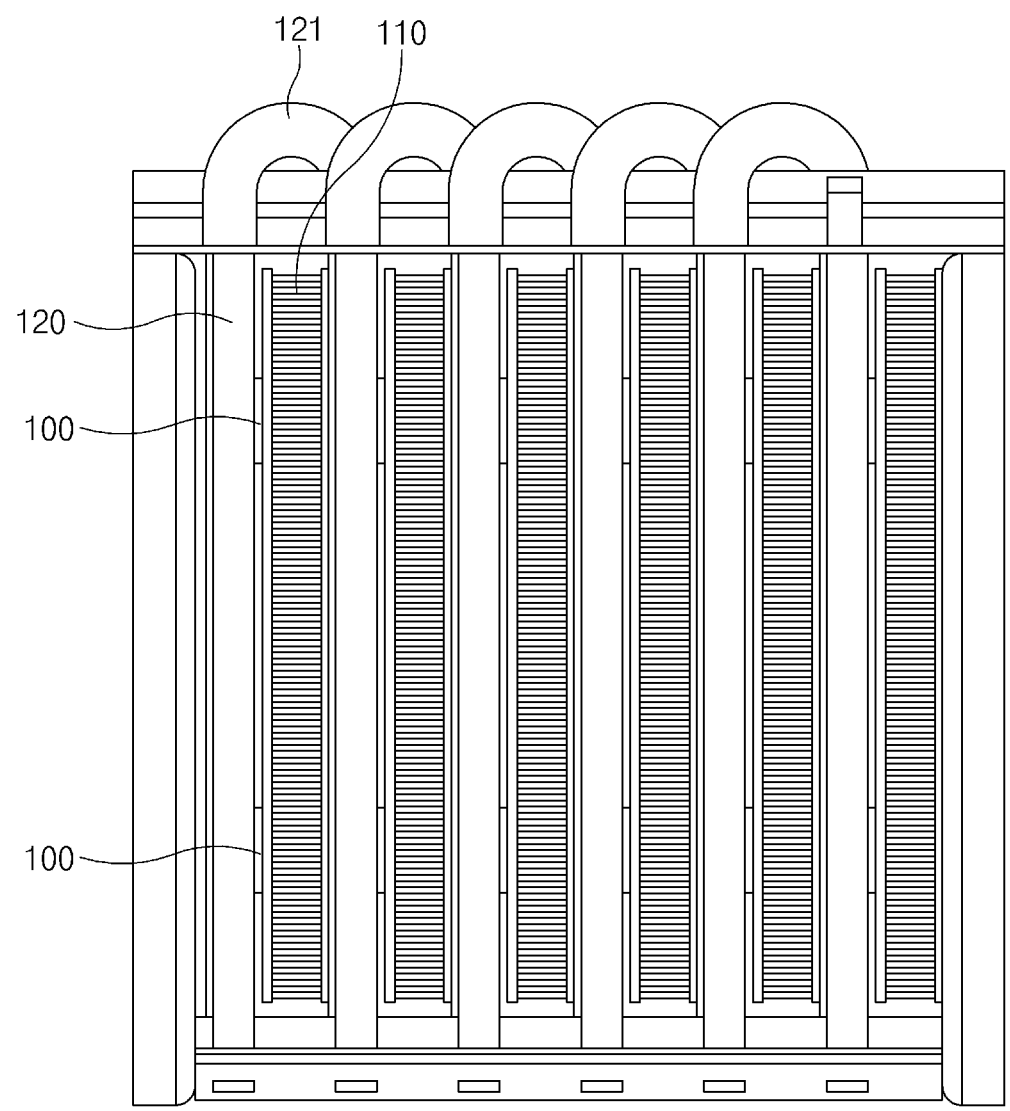
FIG. 1 is a cross-sectional view illustrating a heat exchanging device using a thermoelectric element according to an exemplary embodiment of the present disclosure.
Figure 2:
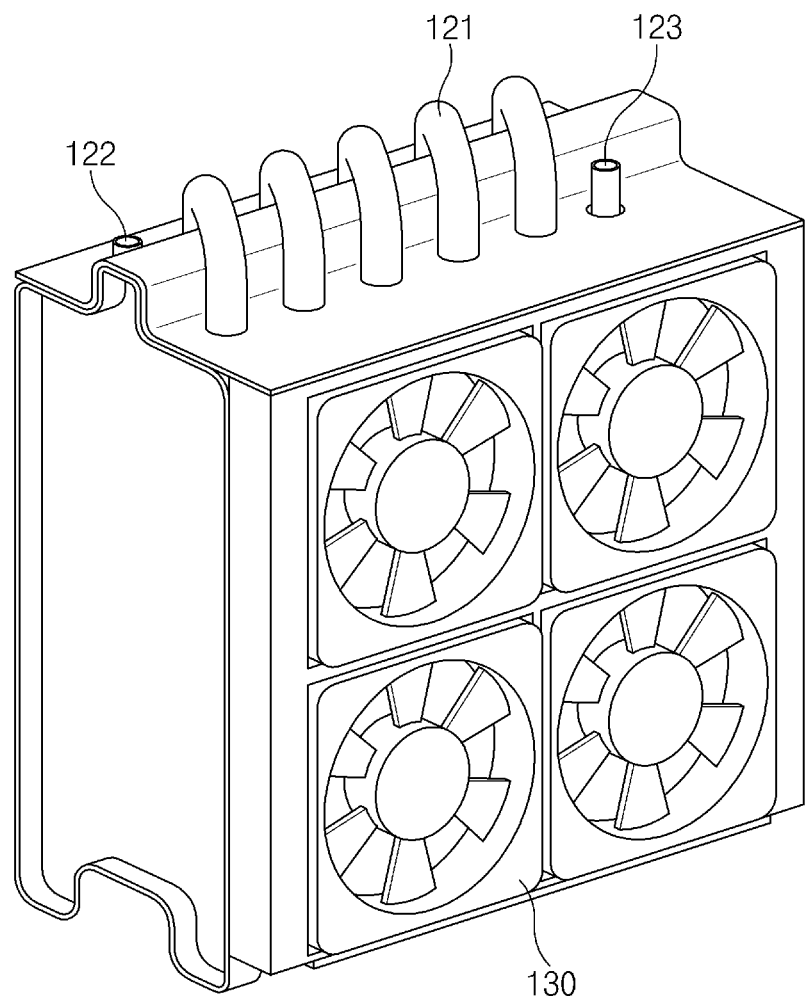
FIG. 2 is a perspective view illustrating an arrangement in which cooling fans are mounted on the heat exchanging device using a thermoelectric element according to an exemplary embodiment of the present disclosure.
Figure 3:
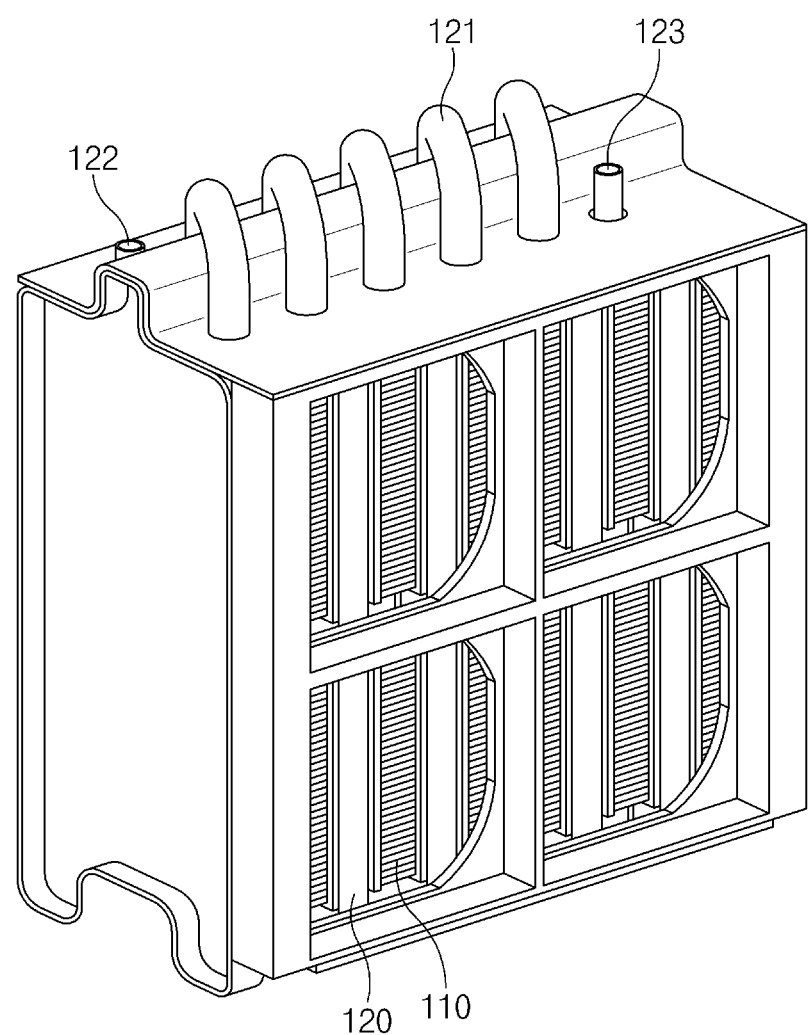
FIGS. 3 and 4 are perspective views illustrating the heat exchanging device using a thermoelectric element according to an exemplary embodiment of the present disclosure.
Figure 4:
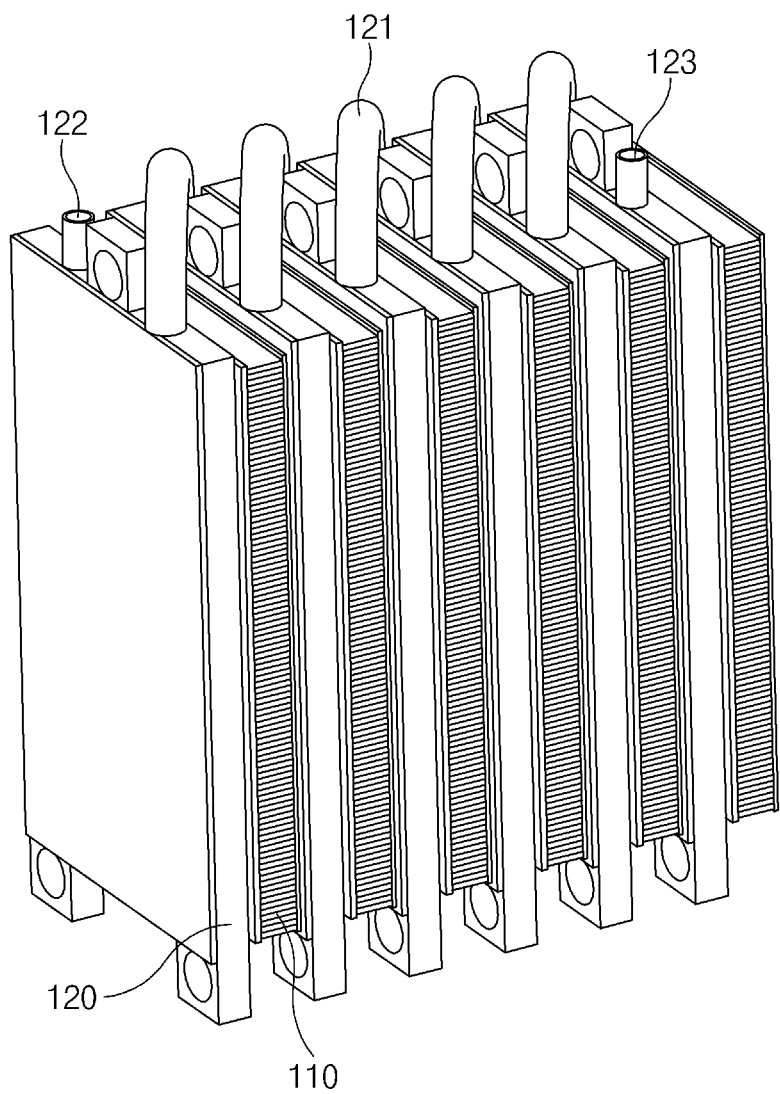

As illustrated in FIG. 1, the thermoelectric element 100 may enable the heat absorption or the heat generation when a voltage is applied thereto.

Here, the heat generation may be generated on one surface of the thermoelectric element 100 and the heat absorption may be generated on the other surface thereof due to a Peltier effect.

Meanwhile, in the thermoelectric element 100, a P-type semiconductor and an N-type semiconductor made of a compound ($Bi_2Te_3$) of bismuth and tellurium may be connected to each other to enable the heat generation on one surface of the thermoelectric element 100 and the absorption of heat on the other surface of the thermoelectric element 100 to occur.

As illustrated in FIGS. 1 to 4, the heat sink 110 may cool the thermoelectric element 100.

The cooling channel 120 may cool the coolant through the heat absorption of the thermoelectric element 100.

Here, the heat sink 110 may be provided on one surface of the thermoelectric element 100 and may enable the thermoelectric element 100 generating the heat to be cooled, and the cooling channel 120 may be provided on the other surface of the thermoelectric element 100 and may cool the coolant in the cooling channel 120 by the heat absorption of the thermoelectric element 100.

Meanwhile, in the present disclosure, a plurality of thermoelectric elements 100, a plurality of heat sinks 110, and a plurality of cooling channels 120 may be provided to form a unit module. A plurality of unit modules may be provided and stacked, and the number of stacked unit modules may be changed depending on a heating value of a battery, thereby making it possible to adjust cooling performance of a heat exchanger. Here, the heat exchanging device using a thermoelectric element according to an exemplary embodiment of the present disclosure may be applied to a battery for a vehicle, but may also may be applied to other fields requiring heat exchange.

In addition, the plurality of cooling channels 120 may be connected to each other through connection hoses 121 to enable circulation of the coolant.

Here, the cooling channel 120 may include an inlet 122 receiving the coolant and an outlet 123 exhausting the cooled coolant, such that the coolant is transferred to the outlet 123 through the inlet 122.

Figure 5:
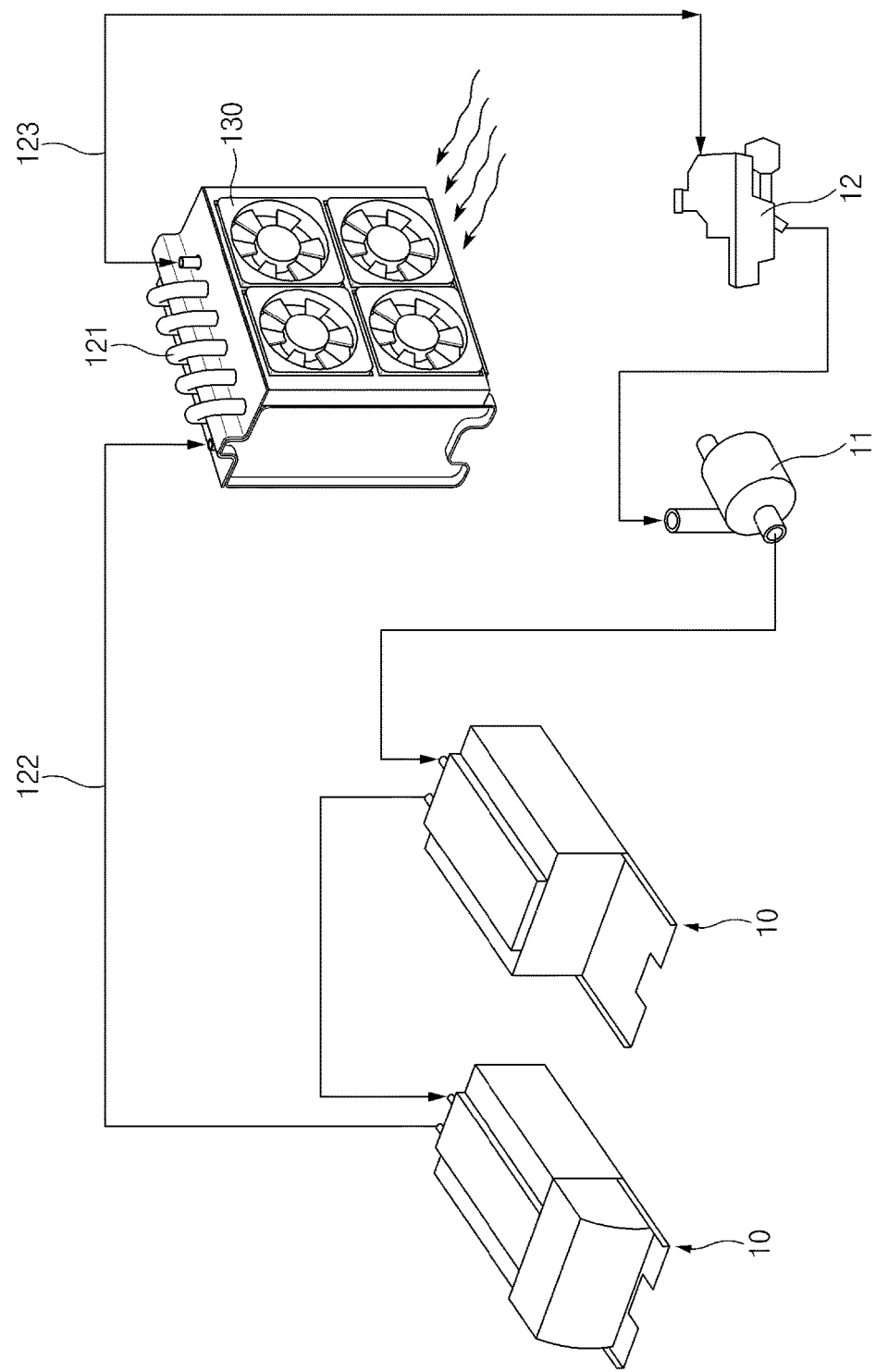
FIG. 5 is a view illustrating an example of the heat exchanging device using a thermoelectric element according to an exemplary embodiment of the present disclosure.

Here, as illustrated in FIG. 5, the inlet 122 may be connected to a battery system to receive the coolant, and the outlet 123 may be connected to a reservoir tank, such that the coolant cooled through the heat exchanging device using a thermoelectric element according to an exemplary embodiment of the present disclosure may be transferred to the reservoir tank to thereby be transferred to another battery system through a cooling pump.

Meanwhile, a plurality of cooling fans 130 may be provided outside the unit module to improve cooling performance.

That is, in the heat exchanging device using a thermoelectric element according to an exemplary embodiment of the present disclosure, the heat sinks 110, the thermoelectric elements 100, and the cooling channels 120 may form the unit module, the unit modules may be stacked to configure an assembly, the number of stacked unit modules may be changed depending on the heating value of the battery to adjust the cooling performance of the heat exchanger. Cooled air may be transferred to the heat sinks 110 using the cooling fans 130 during an operation of the thermoelectric elements 100 to cool hot surfaces of the thermoelectric elements 100, thereby maintaining performance of the thermoelectric elements 100.

In addition, since the heat exchanger according to an exemplary embodiment of the present disclosure may have a structure in which it may be operated independently from a vehicle cooling air conditioning system, a system structure may be simpler as compared with the related art, and a corresponding system weight may be lighter as compared with an existing water cooling type heat management system.

In addition, since the heat exchanging device using a thermoelectric element according to an exemplary embodiment of the present disclosure may use the thermoelectric element 100, the heat exchanging device using a thermoelectric element may also be used as a temperature raising system by heating the battery in a cold weather condition by changing a polarity of the thermoelectric element 100, if necessary.

As described above, the heat exchanging device using a thermoelectric element according to an exemplary embodiment of the present disclosure may include the thermoelectric element 100 having a structure in which the P-type semiconductor and the N-type semiconductor are connected to each other to generate the heat generation on one surface thereof and generate the heat absorption on the other surface thereof when the voltage is applied thereto. The heat sink 110 may be provided on one surface of the thermoelectric element 100 for cooling the thermoelectric element 100, and the cooling channel 120 may be provided on the other surface of the thermoelectric element 100 for cooling the coolant through the heat absorption of the thermoelectric element 100, wherein the plurality of thermoelectric elements 100, the plurality of heat sinks 110, and the plurality of cooling channels 120 may form the unit module, the plurality of unit modules may be provided and stacked, the number of stacked unit modules may be changed depending on the heating value of the battery to adjust the cooling performance, the cooled air may be transferred to the heat sinks 110 using the cooling fans 130 during the operation of the thermoelectric elements 100 to cool heated portions of the thermoelectric elements 100, thereby maintaining the performance of the thermoelectric elements 100. Further, a water cooling type heat management system having a structure independent from the cooling air conditioning system may be implemented, such that installation is easy and a system weight is decreased, and optionally, the heat exchanging device using a thermoelectric element may be used as a temperature raising system for heating the battery in a cold weather condition by changing the polarity of the thermoelectric element 100, thereby improving marketability.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A heat exchanging device using a thermoelectric element, comprising:
   a thermoelectric element for producing heat absorption and heat generation on different surfaces thereof when a voltage is applied thereto;
   a heat sink for cooling the thermoelectric element; and
   a cooling channel for cooling a coolant through the heat absorption of the thermoelectric element,
   wherein a plurality of thermoelectric elements, a plurality of heat sinks, and a plurality of cooling channels form a unit module, and a plurality of unit modules are stacked,
   wherein the plurality of cooling channels are connected to each other through connection hoses, and
   wherein the cooling channel includes an inlet at one side of the cooling channel for receiving the coolant and an outlet at the one side of the cooling channel for exhausting the cooled coolant, so that the inlet and the outlet are located at the same side of the cooling channel.

2. The heat exchanging device using a thermoelectric element according to claim 1, wherein the heat generation is generated on one surface of the thermoelectric element, and the heat absorption is generated on an other surface thereof, such that the heat sink is provided on one surface of the thermoelectric element and the cooling channel is provided on the other surface of the thermoelectric element.

3. The heat exchanging device using a thermoelectric element according to claim 1, wherein the thermoelectric element is formed by connecting a P-type semiconductor and an N-type semiconductor, made of a compound ($Bi_2Te_3$) of bismuth and tellurium, to each other.

4. The heat exchanging device using a thermoelectric element according to claim 1, wherein a plurality of cooling fans are provided outside the unit module.

5. A heat exchanging device using a thermoelectric element, comprising:
   a thermoelectric element having a structure in which a P-type semiconductor and an N-type semiconductor are connected to each other to produce heat generation on one surface thereof and generate heat absorption on the other surface thereof when a voltage is applied thereto;
   a heat sink provided on one surface of the thermoelectric element for cooling the thermoelectric element; and
   a cooling channel provided on the other surface of the thermoelectric element for cooling a coolant through the heat absorption of the thermoelectric element,
   wherein a plurality of thermoelectric elements, a plurality of heat sinks, and a plurality of cooling channels are provided to form a unit module, and a plurality of unit modules are provided and stacked;
   wherein the plurality of cooling channels are connected to each other through connection hoses, and the cooling channel includes an inlet at one side of the cooling channel for receiving the coolant and an outlet at the one side of the cooling channel for exhausting the cooled coolant, so that the inlet and the outlet are located at the same side of the cooling channel.

* * * * *